United States Patent [19]
Omori

[11] Patent Number: 5,886,870
[45] Date of Patent: Mar. 23, 1999

[54] HEAT SINK DEVICE

[75] Inventor: Akimitsu Omori, Tokyo, Japan

[73] Assignee: Kabushiki Kaisha Toshiba, Kawasaki, Japan

[21] Appl. No.: 744,827

[22] Filed: Nov. 6, 1996

[30] Foreign Application Priority Data

Nov. 7, 1995 [JP] Japan ................................ 7-287745

[51] Int. Cl.⁶ .................................................. H05K 7/20
[52] U.S. Cl. ....................... 361/704; 165/80.3; 165/185; 174/16.3; 257/718; 361/690
[58] Field of Search ................... 165/80.2, 80.3, 165/185; 174/16.3; 257/706–707, 712–713, 718–719, 722; 361/688, 690, 697, 703–704, 707, 710, 717–718, 722

[56] References Cited

U.S. PATENT DOCUMENTS 5,673,177  9/1997  Brodsky et al. ..................... 361/704

Primary Examiner—Gregory D. Thompson
Attorney, Agent, or Firm—Oblon, Spivak, McClelland, Maier & Neustadt, P.C.

[57] ABSTRACT

A heat sink apparatus including a heat conducting plate which is in contact with an IC device to conduct heat generated in the IC device, cooling fins which are mounted at a center section of the heat conducting plate to radiate the generated heat conducted, and protection pins which are mounted on a periphery of the heat conducting plate to protect the cooling fins. The heat sink apparatus has improved reliability and safety during handling.

9 Claims, 10 Drawing Sheets

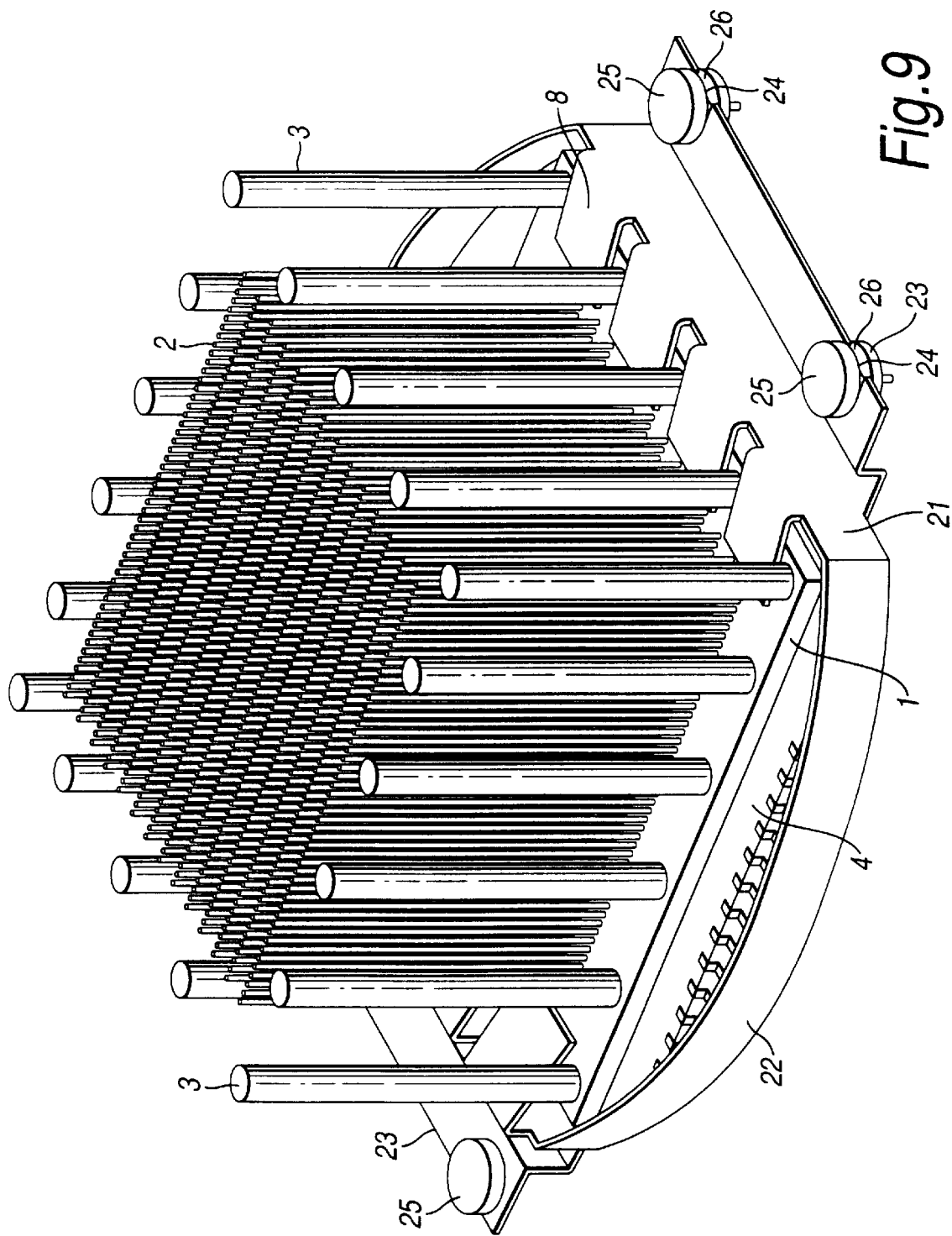

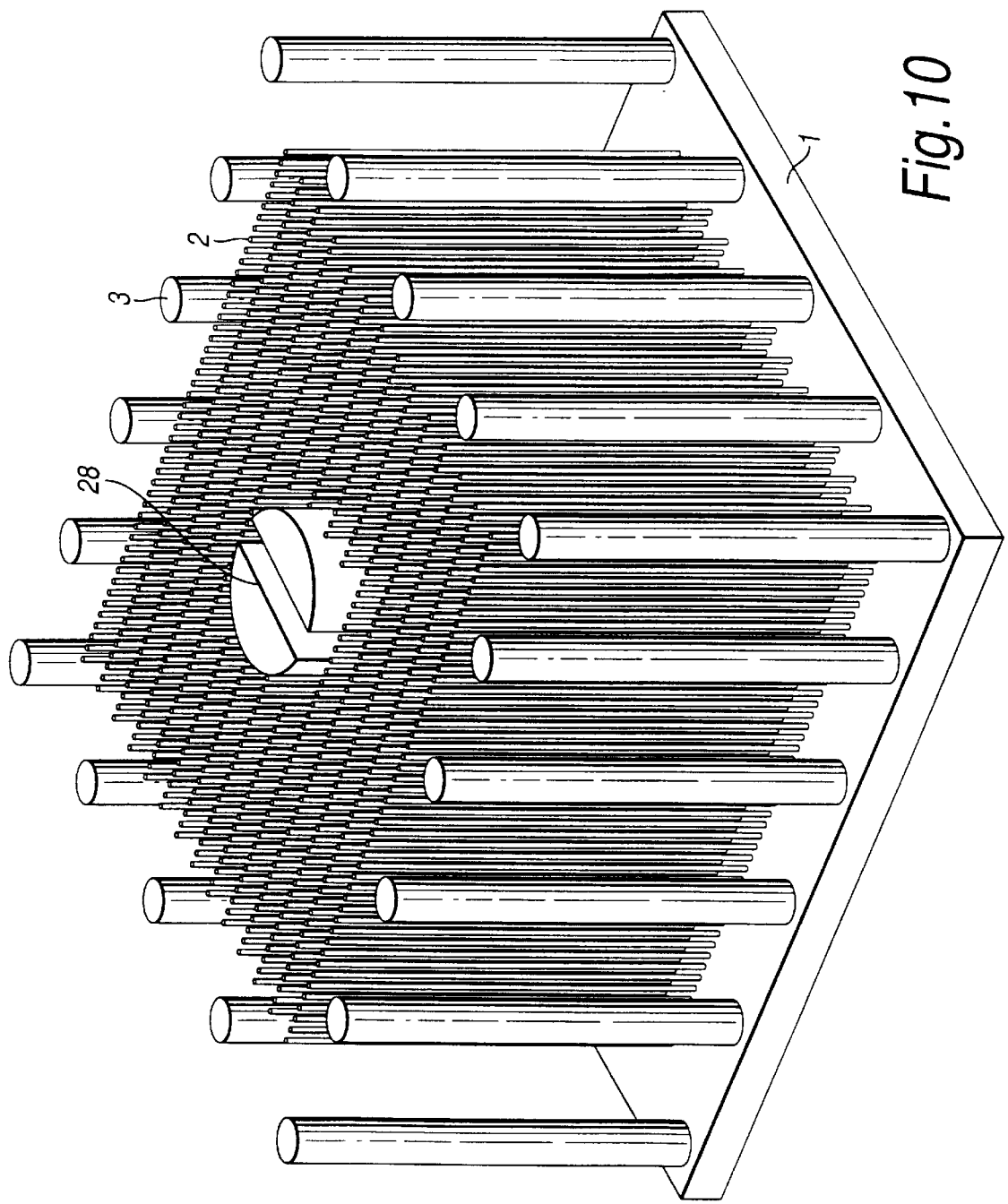

HEAT SINK DEVICE

BACKGROUND OF THE INVENTION

High-speed processing of an IC tends to increase a heating value. On the other hand, the IC has to be key at or below a certain temperature because of the IC's inner material and other characteristics. When the IC's heating value becomes a prescribed level or higher, release of heat from the IC surface requires a lot of cooling air commensurate with the heating value due to the limited heating surface area.

Therefore, it is necessary to have an expanded heating surface area in order to increase the heating surface area in contact with the cooling air. Various type of heat sinks have been devised as a method for attaining an expanded heating surface area. However, a conventional heat sink shape is limited to whatever shape it may have. On the other hand, there is literature reporting fine pin fins which further improve the radiating performance of a conventional heat sink.

Specifically, the shape of a heat sink to deal with the increase of a heating value in the future is limited, if the conventional shape is continued. Conventional devices are now designed to have a new shape so as to provide very small fins. In using a heat sink having such a finely made shape, the following problems take occur:

(1) Since the fin section of the heat sink is finely worked, if an external force is applied to the finely worked fin section when handling the heat sink (e.g., installation of the heat sink, test, maintenance or transportation of a device or unit equipped with the heat sink), the fin section is readily deformed, requiring very gentle handling. Thus, this design has a disadvantage that workability is degraded.

In addition, if the heat sink is deformed, the flow of a cooling air is changed and the cooling capacity is degraded.

Furthermore, from an opposite viewpoint, when workability is given priority, the finely worked fins of a heat sink cannot be used, also resulting in limited cooling capacity.

(2) Sealing of the circumference of a finely worked section could not be adopted because of clogging due to dust.

(3) In an area of a printed circuit board where high-heat generating ICs are mounted, other parts are also mounted and connected mutually to form the printed circuit board. However, cooling is mainly performed by cooling the printed circuit board as a whole. This is because it is often necessary to cool the parts other than the high-heat generating ICs.

When the air is delivered to cool the whole circuit board, however, the above-described finely worked heat sink has a disadvantage that it has a high air resistance and the cooling air does not flow.

SUMMARY OF THE INVENTION

Accordingly, it is an object of the present invention to provide a heat sink apparatus for protecting a finely worked fin section in order to improve the cooling capacity of a heat sink, and also for providing a function of preventing the cooling capacity from lowering due to the increase in air flow resistance.

It is another object of the present invention to provide a heat sink apparatus which improves the heat sink performance and enables the high-speed operation with high heat generation of ICs.

The above and other objects are achieved, according to one embodiment of the present invention, by providing a heat sink apparatus including a heat conducting plate which is in contact with an IC device to conduct heat generated in the IC device, cooling fins which are mounted at the center section of the heat conducting plate to radiate the generated heat conducted, and protection pins which are mounted on the periphery of the heat conducting plate to protect the cooling fins.

According to another aspect of the present invention, a heat sink apparatus is provided, wherein the protection pins are circular pins thicker than the cooling fins and at a same height or higher than said cooling fins.

According to another aspect of the present invention, a heat sink apparatus is provided, wherein said heat conducting plate is mounted on an IC device by a holding member having notches which can be fitted to the protection pins to hold two sides of the heat sink, so that the heat sink can be prevented from moving.

According to another aspect of the present invention, a heat sink apparatus is provided, wherein the holding member has slightly inclining holding claws to make them work as a spring to obtain an appropriate pressure.

According to another aspect of the present invention, a heat sink apparatus is provided, wherein the holding member is a nearly square frame having a curved spring member which is used to join or integrally form the frame members having the holding claws on both sides of the square frame.

According to another aspect of the present invention, a heat sink apparatus is provided, wherein the frame has an elongated portion bent in the shape of Z on which a pair of engaging notchs are formed at an edge of the elongated portion, and the heat sink apparatus further includes a pair of columns having a peripheral groove which are planted on the printed circuit board, the pair of engaging notchs being engaged with the pair of columns at their peripheral groove.

According to another aspect of the present invention, a heat sink apparatus is provided including a square heat conducting plate which is in contact with an IC device to conduct heat generated in the IC device, cooling fins which are mounted at a center section of the heat conducting plate to radiate the generated heat conducted, protection pins which are mounted on two opposed sides of the heat conducting plate to protect the cooling fins, and panel protection devices which are mounted on two other opposed sides of the heat conducting plate in a parallel fashion to protect the cooling fins.

According to another aspect of the present invention, a heat sink apparatus is provided, wherein the mutually opposed protection devices are a pair of walls mounted on said heat conducting plate in a sloped fashion wherein the distance between the walls at one end is wider than the distance at the other end, so that cooling air can be taken in from the one end wider than the other end to enhance the cooling capacity.

According to another aspect of the present invention, a heat sink apparatus is provided including a heat conducting plate which is in contact with an IC device to conduct heat generated in the IC device, cooling fins which are mounted at the center section of the heat conducting plate to radiate the generated heat conducted, and rectangular protection guards which are mounted on the periphery of the heat conducting plate to protect the cooling fins.

According to another aspect of the present invention, a heat sink apparatus is provided including a heat conducting plate which is in contact with an IC device to conduct heat generated in the IC device, cooling fins which are mounted at the center section of the heat conducting plate to radiate the generated heat conducted, and grid protection guards which are mounted on the periphery of the heat conducting plate to protect the cooling fins.

According to another aspect of the present invention, a heat sink apparatus is provided, wherein the protection guards have a circular or polygonal shape circular or polygonal other than a grid shape.

BRIEF DESCRIPTION OF THE DRAWINGS

A more complete appreciation of the invention and many of the attendant advantages thereof will be readily obtained as the same becomes better understood by reference to the following detailed descriptions when considered in connection with the accompanying drawings, wherein:

FIG. 9 is a perspective view showing showing the heat sink apparatus according to other embodiment of the present invention; and FIG. 10 is a perspective view showing the heat sink apparatus according to other embodiment of the present invention.

DESCRIPTION OF THE PREFERED EMBODIMENTS

Figure 1:
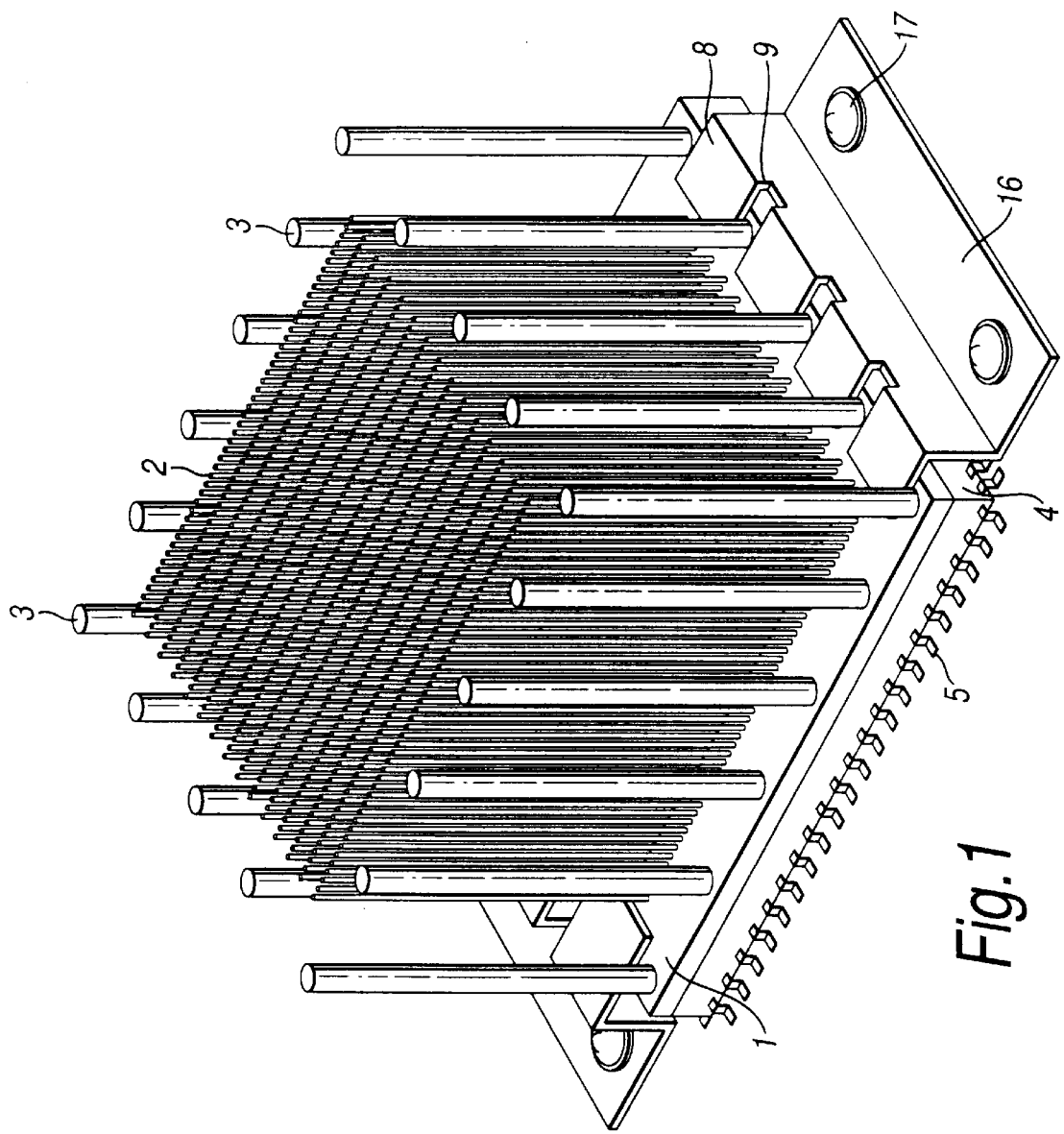
FIG. 1 is a perspective view showing the heat sink apparatus according to one embodiment of the resent invention.

Referring now to the drawings, wherein like reference numerals designate identical or corresponding parts throughout the several views, and more particularly to FIG. 1 thereof, there is illustrated a heat sink apparatus including a heat conducting plate 1 (i.e., a heat sink or heat conductor) which is in contact with an IC device (integrated circuit) 4 to conduct heat generated in the IC device 4. Cooling fins 2 are parts which are mounted at the center section of the heating plate 1 to radiate the generated heat conducted. Protection pins 3 are parts which are mounted on the periphery of the heat conducting plate 1 to protect the cooling fins 2.

Namely, these protection pins 3 are to prevent the fins 2 from being deformed and are made up of circular rods thicker than the cooling fins 2. The protection pins 3 are mounted on the periphery of the cooling fins 2 and are touched during handling.

These thick protection pins 3 are a same height or higher than the inside cooling fins 2, so that the cooling fins 2 are not touched from above.

This heat sink can be mounted to the IC device 4 by adhering or by means of a holding member 16.

The holding member 16 shown in FIG. 1 has notches 9 which can be fitted to the protection pins 3 to hold two sides of the heat sink. In this way, the heat sink can be prevented from moving in any of vertical, horizontal, and back-to-forth directions. The joining force of the IC device 4 is attained by slightly inclining holding claws 8 which work as a spring to obtain an appropriate pressure. The notches 9 are designed to engage with the protection pins 3, to not only prevent the heat sink from moving, but also provide higher reliability with a pressure lower than holding by a single spring. This is because the spring section is divided into several parts which have respective holding forces. Accordingly, loss of a holding force due to the deformation of a single spring can be supplemented by the other springs. Therefore, the above structure provides a holding force appropriate for the IC device 4 without using an excessive holding force. The holding member 16 has fixing screws 17, but a securing structure other than screws may be used. In addition, holding claws having a structure similar to the one for the IC device 4 shown in the figure are used to secure the printed circuit board (not shown) on which the IC device 4 is mounted.

Figure 2:
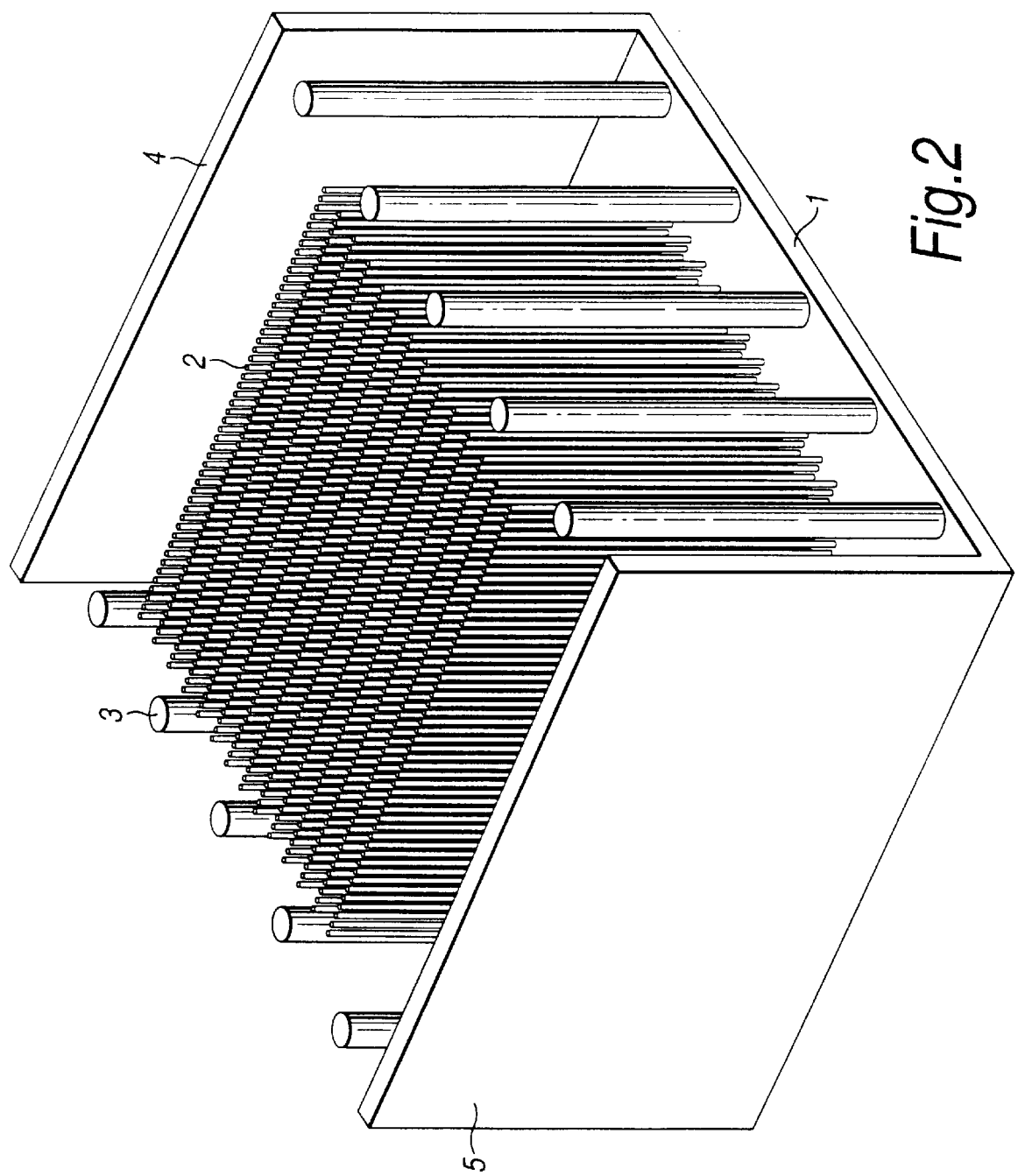
FIG. 2 is a perspective view showing the heat sink apparatus according to another embodiment of the present invention.

FIG. 2 is a perspective view showing the heat sink apparatus according to another embodiment of the present invention. In this embodiment, the protection pins 3 are mounted on the two mutually opposed sides of the heat conducting plate 1 to protect the cooling fins, and panel protection devices 4 and 5 are mounted on two other opposed sides of the heat conducting plate 1 in a parallel fashion to protect the cooling fins 2. With this structure, the sides which are parallel to the air flow (the flow is mostly parallel to the direction intended because of eddies) are made of walls 4 and 5 having high rigidity instead of the above-described protection pins 3. Since the supported parts which are used for carrying or mounting are walls, the cooling flow can be taken in with less restriction, and the heat sink can be held or packaged with ease. In addition, the above-described holding member can be fitted.

Figure 3:
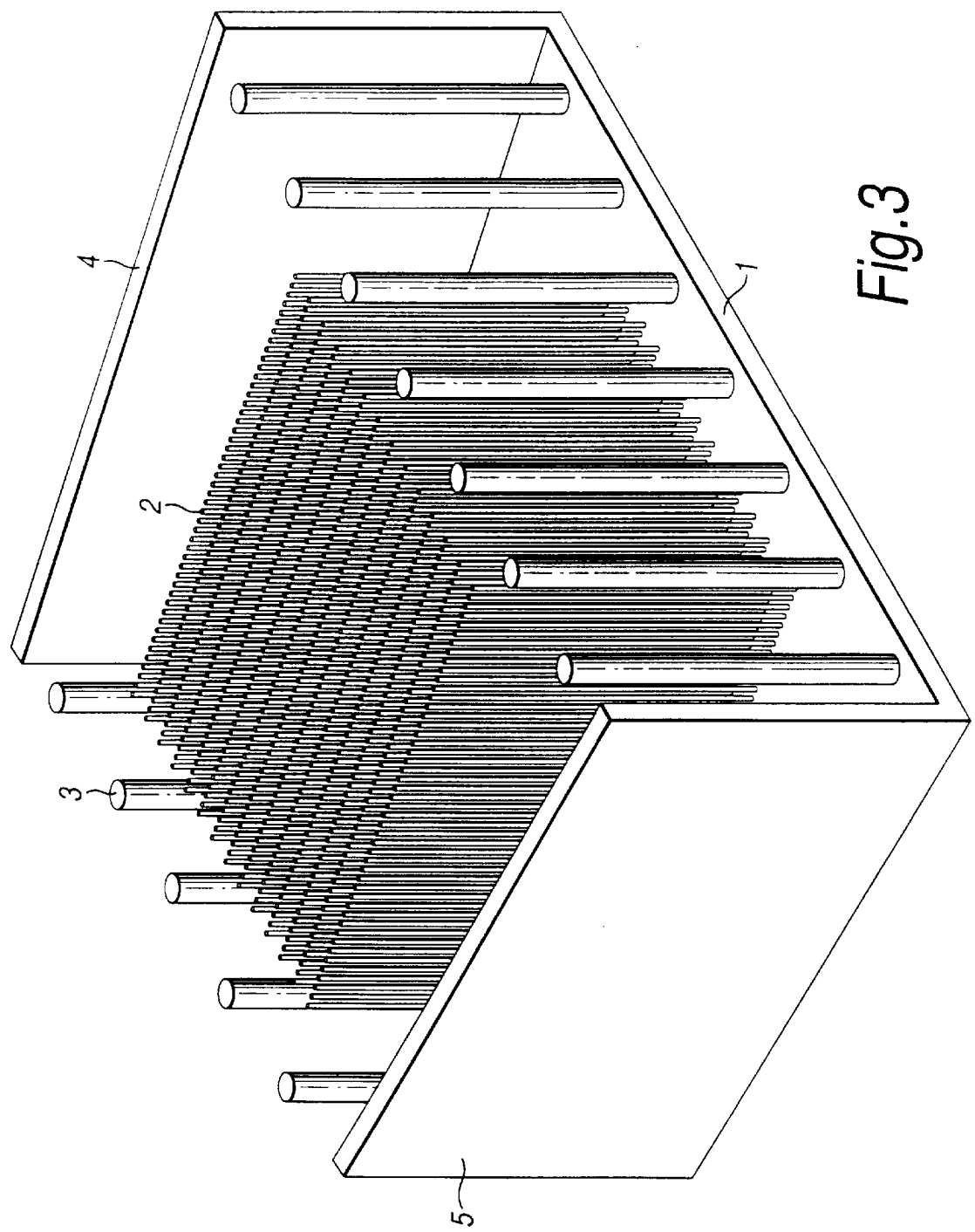
FIG. 3 is a perspective view showing the heat sink apparatus according to other embodiment of the present invention.

FIG. 3 is a modification to the heat sink apparatus shown in FIG. 2 in which mutually opposed protection devices 4, 5 mounted on the heat conducting plate 1 are inclined and mounted on the heat conducting plate 1. By inclining the walls 4 and 5 so that the distance between the walls at one end is wider than the distance at the other end, cooling air can be taken in with a larger volume than in the embodiment of FIG. 2, and the cooling capacity can be enhanced.

Moreover, by concentrating the cooling air, an air velocity is increased and the cooling performance is improved. The walls shown in FIG. 2 and FIG. 3 can guide an exhaust flow in a desired direction even when the cooling air is delivered from above.

Figure 4:
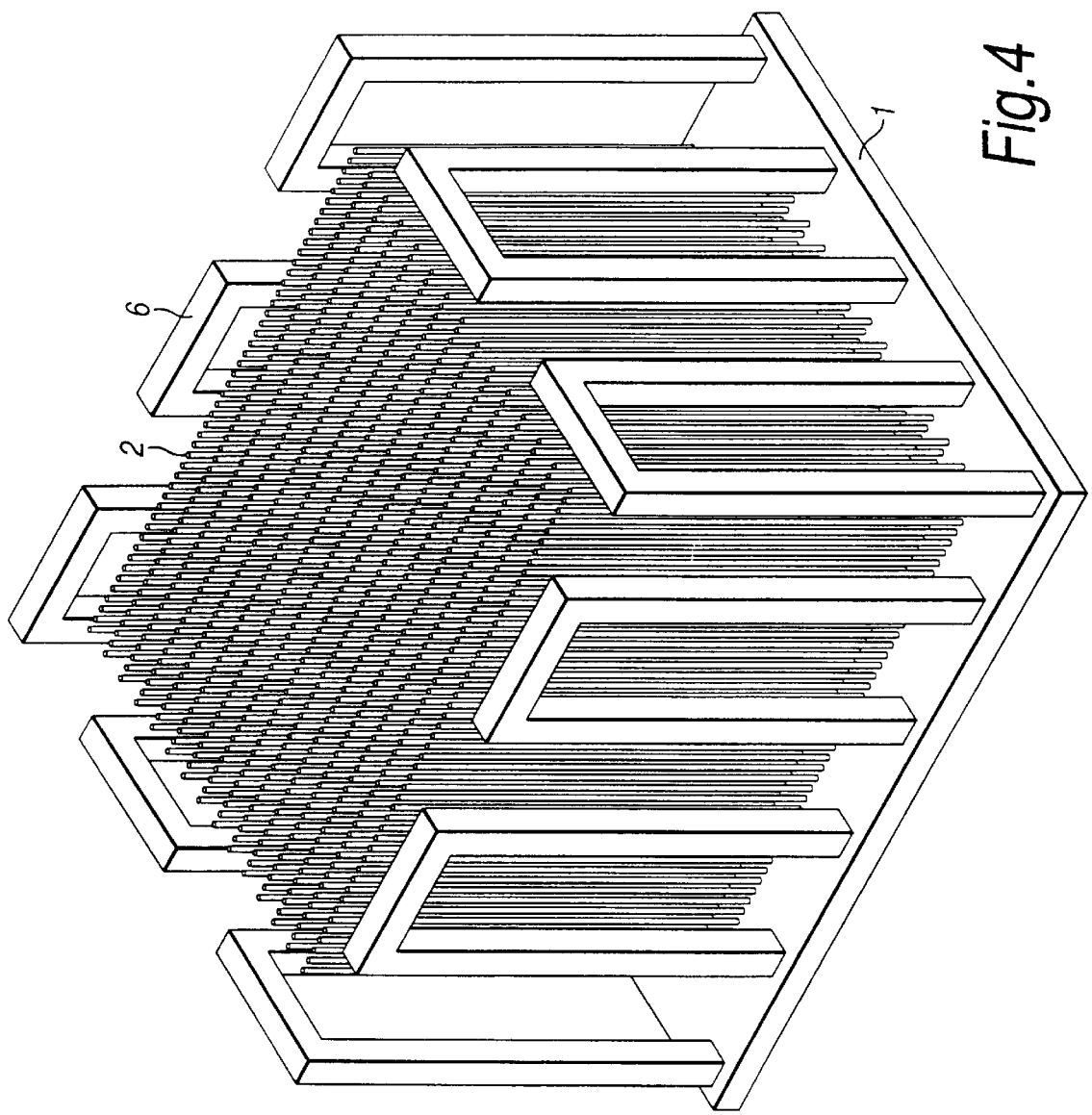
FIG. 4 perspective view showing showing the heat sink apparatus according to other embodiment of the present invention another embodiment.
Figure 5:
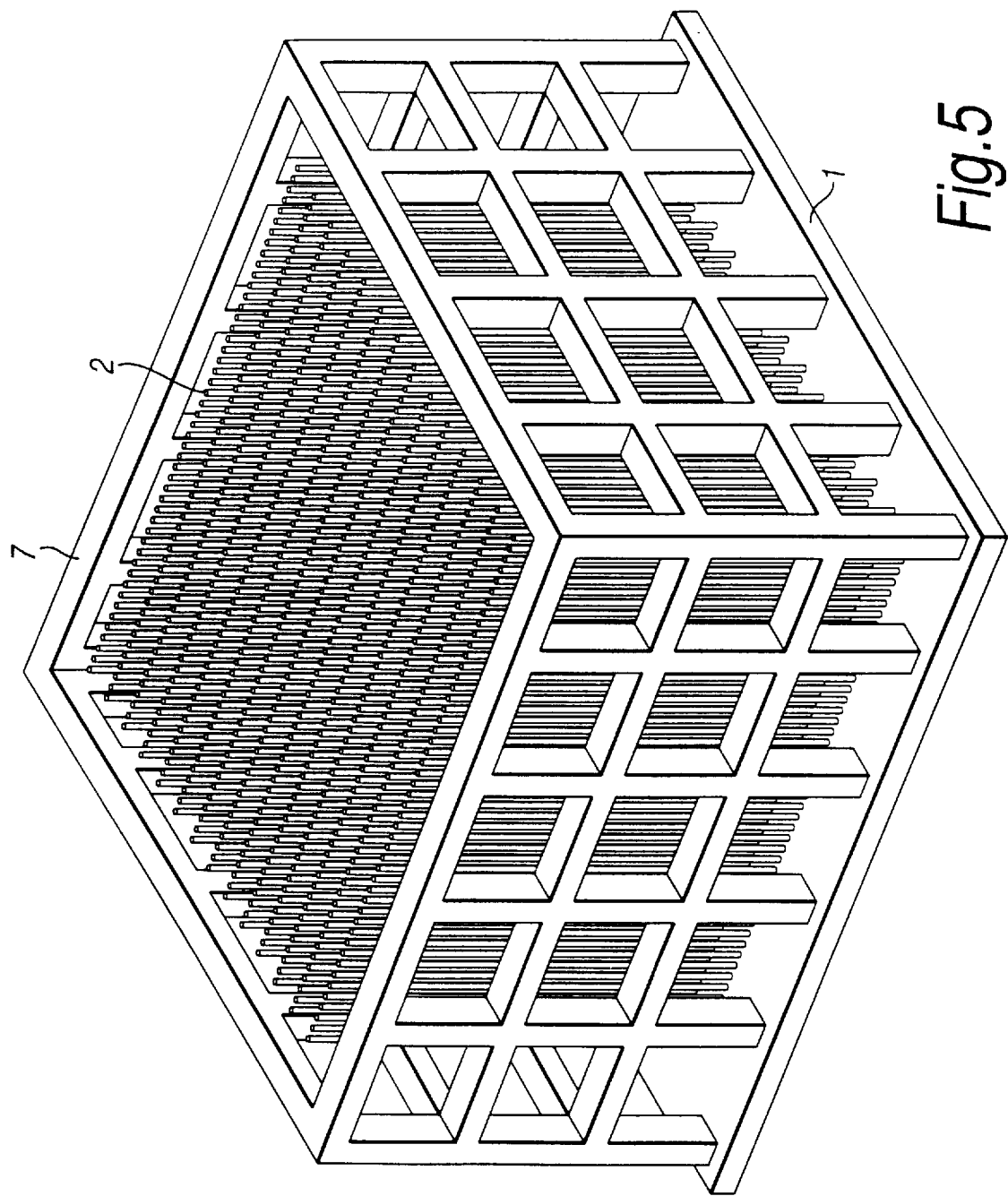
FIG. 5 is a perspective view showing the heat sink apparatus according to other embodiment of the present invention.

FIG. 4 shows a heat sink apparatus of another embodiment, wherein the mutually opposed protection devices are not panels, but rather rectangular guards 6. FIG. 5 shows a heat sink apparatus of still another embodiment, wherein the mutually opposed protection devices are not panels but rather a grid guard 7. In this embodiment, the mutually opposed protection devices may have a circular or polygonal shape instead of a grid shape.

In the above embodiments, the fin section has pin-shaped fins 2 having a diameter of less than 1 mm arranged and pin-shaped columns 3 having a diameter of 1 mm or more for protection arranged on the periphery of the heat sink structure for protection.

However, these protection columns are not only independent ones but also rectangular ones, and the heat sink can have a structure that a net protection member, a grid protection member or the like to prevent the inside fins from being directly touched by hand can be used instead of the protection pins having a diameter of 1 mm or more, and the inside fins are arranged at a certain space therebetween to allow the cooling air to pass through and so as not to be deformed by handling in various situations.

With respect to the structure of the fin section and of the protection structure at the inlet and the outlet for the cooling air, the wall members (fine mesh net, etc.) through which air is harder to flow than in the fin section may be provided at the section other than the inlet and the outlet in the heat sink, or the circular or polygonal protection member can be provided on a periphery other than a square one.

In FIG. 1, holding member 16 which holds the IC device 4 and the heat conducting plate 1 by the holding claws 8 and the fixing screws 17 is Z-shaped thereby preventing leads 5a of the IC device 4 from being moved. The protection pins 3 pass through the notches 9 formed on the holding member 16.

Figure 6:
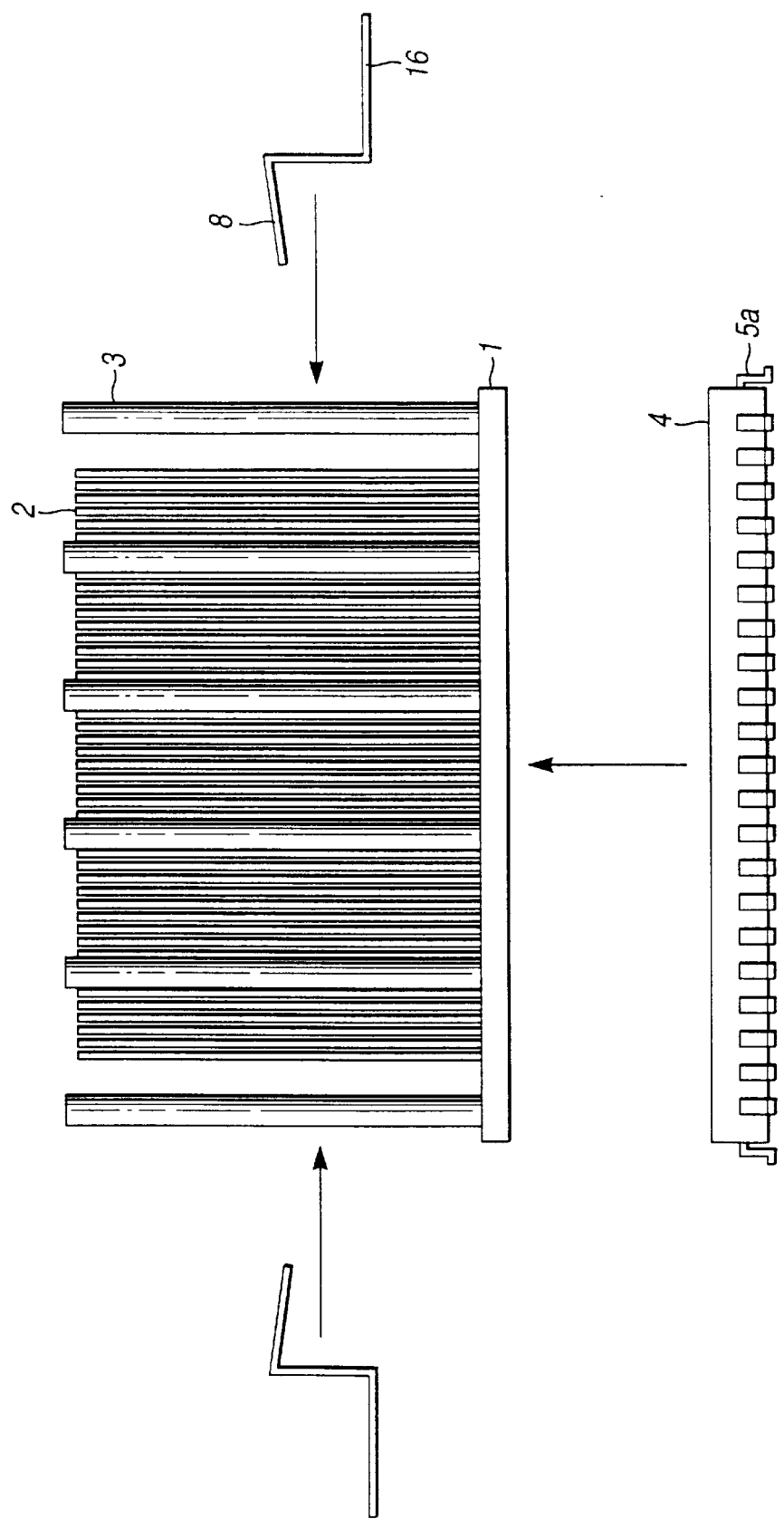
FIG. 6 is a front view showing the disassembled heat sink apparatus of FIG. 1.
Figure 7:
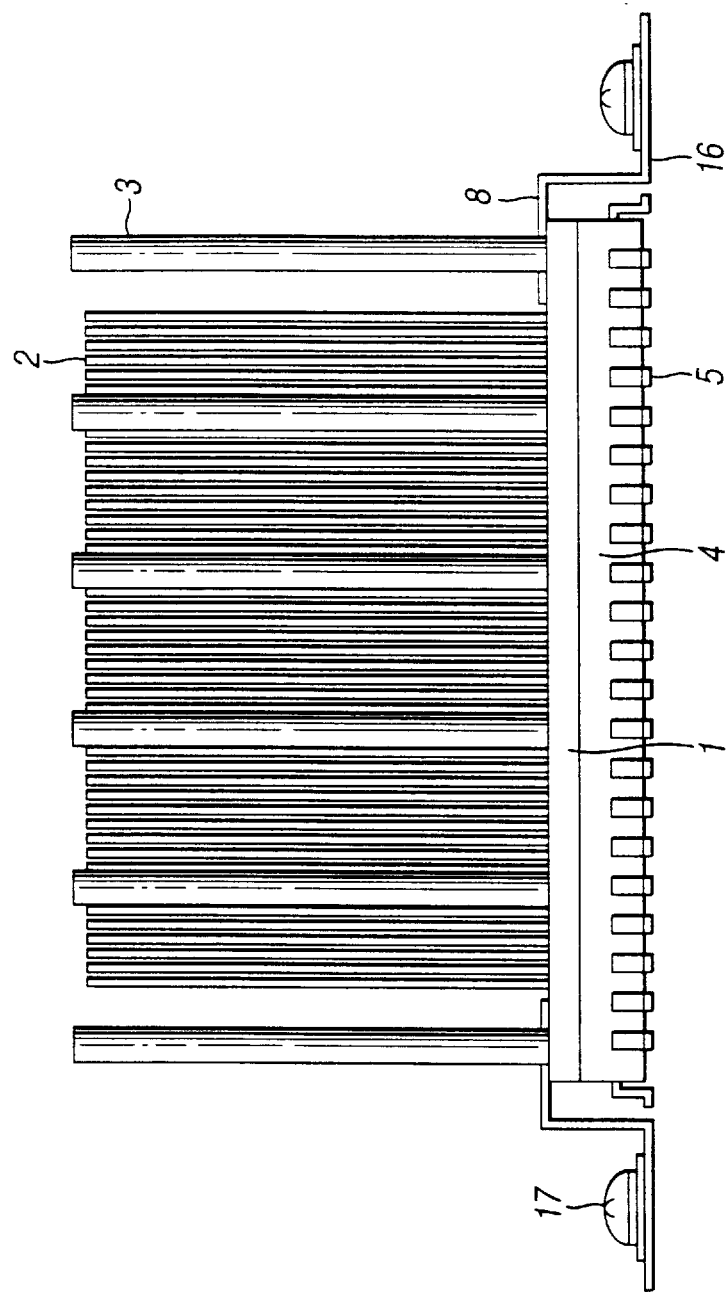
FIG. 7 is a front view of the heat sink apparatus of FIG. 1.

FIG. 6 is a front view of the heat sink apparatus shown in FIG. 1 in a disassembled state, and FIG. 7 is a front view of the heat sink apparatus shown in FIG. 1 in an assembled state.

Figure 8:
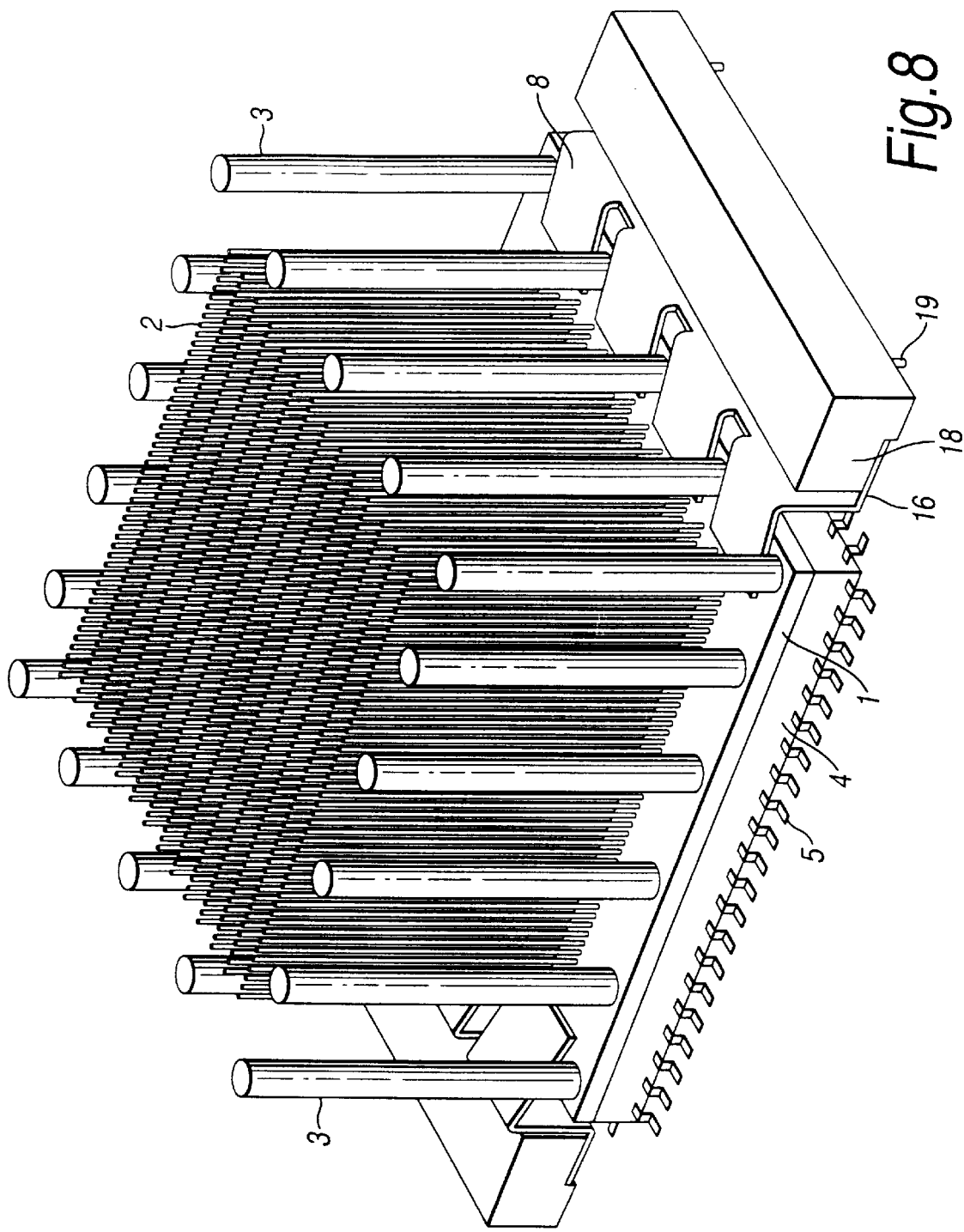
FIG. 8 is a perspective view showing the heat sink apparatus according to other embodiment of the present invention.

The holding member 16 shown in FIG. 8 is provided with a fixture 18 for fixing the holding member 16 and having legs 19 for fixing the printed circuit board (not shown).

FIG. 9 shows yet other heat sink apparatus, in which the holding member is a nearly square frame 21, having a curved spring member 22 which is used to join or integrally form the frame members having holding claws 8 on both sides of the square frame 21. The frame 21 has an elongated portion 23 bent in the shape of Z on which a pair of engaging notchs 24 are formed at the edge of the elongated portion 23. A pair of columns 25 having a peripheral groove 26 are planted on the printed circuit board (not shown). The column 23 has a boss which can be soldered to the printed circuit board.

The pair of engaging notchs 24 are engaged with the pair of columns 25 at their peripheral groove 26. The frame 21 also has a plurality of holding claws 8 separated from each other by notches 9 for fixing heat conducting plate 1 and IC device 4. The holding claws 8 have a right angle or less, so that the heat sink is held by a spring resilience of the holding claws 8 when the side opposite to the holding claws 8 is fixed.

In the above-described heat sink apparatus, the frame 21 can be removed from the column 25 by applying a force so as to push the frame toward heating board 1 and IC device 4 to decrease a radius of the curved spring member 22.

This structure is characterized by the columns 25 which enable easy mounting and removal without requiring a screw or a special tool and allow mounting in same way as the ordinary mounting of parts on the printed circuit board.

FIG. 10 shows another heat sink apparatus, which is characterized by having a fixing nut 28, for fixing the heat conducting plate 1, at the center of the cooling fins 2. With the above-described configuration, even when dust adheres to the heat sink, cleaning can be made by a periodic inspection when the top is open. In this way, when the dust has a large size, it is blown upward by the cooling air blown below the dust. When the above device is used in an environment with lots of dust, the staggered arrangement of the above-described protection pins enables a flow of cooling air even if dust is on the protection pins.

The present invention can improve the reliability of a heat sink apparatus.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A heat sink apparatus for cooling a device, comprising:
   a heat conducting plate having a plurality of linear peripheries and first and second surfaces, the first surface adapted to be in contact with the device to be cooled;
   cooling fins which are mounted on the second surface of the heat conducting plate to radiate heat generated by the device to be cooled; and
   protection pins which are mounted on the second surface along the linear peripheries of the heat conducting plate at intervals smaller than a length of each of the linear peripheries and so as to surround and protect the cooling fins.

2. A heat sink apparatus according to claim 1, wherein a protection pins are circular pins thicker than the cooling fins and having a same height or higher than the cooling fins.

3. A heat sink apparatus according to claim 1, further comprising:
   a holding member;
   wherein the heat conducting plate is adapted to be mounted on the device to be cooled by the holding member having notches fitted to the protection pins and adapted to hold the heat conducting plate against the device to be cooled so that the heat conducting plate is prevented from moving.

4. A heat sink apparatus according to claim 3, wherein the holding member further includes inclined holding claws which are adapted to act as a spring for holding the heat conducting plate against the device to be cooled with an appropriate pressure.

5. A heat sink apparatus according to claim 4, wherein said holding member is a nearly square frame having a curved spring member which is used to join or integrally form said holding claws on both sides of said square frame.

6. A heat sink apparatus according to claim 5, wherein said frame has an elongated portion bent in the shape of Z on which a pair of engaging notches are formed at the edge of the elongated portion, and said heat sink apparatus further comprises a pair of columns having a peripheral groove which are adapted to be mounted on a printed circuit board, said pair of engaging notches being engaged with said pair of columns at the peripheral grooves thereof.

7. A heat sink apparatus according to claim 1, wherein said protection pins comprise rectangular protection guards which are mounted on the linear peripheries of the heat conducting plate to protect the cooling fins.

8. A heat sink apparatus according to claim 1, wherein said protection pins comprise grid protection guards which are mounted on the linear peripheries of the heat conducting plate to protect the cooling fins.

9. A heat sink apparatus according to claim 8, wherein said protection guards are one of circular, polygonal circular, and polygonal other than a grid.

* * * * *